US007551490B2

United States Patent
Kim

(10) Patent No.: US 7,551,490 B2
(45) Date of Patent: Jun. 23, 2009

(54) FLASH MEMORY DEVICE AND METHOD OF READING DATA FROM FLASH MEMORY DEVICE

(75) Inventor: Ho-jung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 188 days.

(21) Appl. No.: 11/606,932

(22) Filed: Dec. 1, 2006

(65) Prior Publication Data

US 2008/0123432 A1    May 29, 2008

(30) Foreign Application Priority Data

Nov. 3, 2006    (KR) .................. 10-2006-0108529

(51) Int. Cl.
*G11C 16/06* (2006.01)
(52) U.S. Cl. ...................... 365/185.25; 365/185.17; 365/185.21
(58) Field of Classification Search ............ 365/185.17, 365/185.21, 185.25
See application file for complete search history.

(56) References Cited

U.S. PATENT DOCUMENTS 6,674,668 B2 *   1/2004   Ikehashi et al. ........ 365/185.24
7,154,804 B2 *  12/2006   Takazawa et al. ........... 365/229

FOREIGN PATENT DOCUMENTS

| JP | 11-086574 | 3/1999 |
| KR | 1020020050367 | 6/2002 |
| KR | 1020050002245 | 1/2005 |

* cited by examiner

*Primary Examiner*—Hoai V Ho
(74) *Attorney, Agent, or Firm*—Volentine & Whitt, PLLC

(57) ABSTRACT

A method of reading data from a flash memory device that includes a multiple block memory cell array, each block having a cell string connected to a bit line and comprising a string select transistor connected to a string select line, a memory cell connected to a wordline and a global select transistor connected to a global select line and having a source connected to a common source line. The method includes precharging the bit lines to a first voltage in a standby state, discharging a selected bit line connected to a selected memory cell to a second voltage in response to a read command, and reading data stored in the selected memory cell in response to the read command.

18 Claims, 7 Drawing Sheets

FLASH MEMORY DEVICE AND METHOD OF READING DATA FROM FLASH MEMORY DEVICE

BACKGROUND OF THE INVENTION

1. Field of the Invention

The present invention relates to a flash memory device. More particularly, the invention relates to a method of reading data from a flash memory device, which is capable of pre-charging bit lines in a standby state to minimize coupling capacitance between neighboring bit lines during the read operation in order to remove coupling noise.

This application claims the benefit of Korean Patent Application No. 10-2006-0108529, filed on Nov. 3, 2006, the subject matter of which is hereby incorporated by reference.

2. Description of the Related Art

Semiconductor memory devices may be classified as volatile memory devices and non-volatile memory devices according to their ability to retain stored data in the absence of continuously applied power. The class of non-volatile memory devices includes electrically erasable and programmable read only memory (EEPROM).

EEPROM operates in several fundamental modes, including; a programming mode adapted to write data to the non-volatile memory cells, a read mode adapted to read data stored in the non-volatile memory cells, and an erase mode adapted to erase data stored in the non-volatile memory cells.

Flash memory is one type of EEPROM and performs its erase operation on a block by block or sector by sector basis. Contemporary flash memory is implemented as either NAND type flash memory in which cell transistors are arranged in series between bit lines and a ground terminal, or NOR type flash memory in which cell transistors are arranged in parallel between bit lines and the ground terminal. NAND type flash memory is generally unable to execute read and programming operations on a byte by byte basis, but provides high speed programming and erase operations as compared to NOR type flash memory.

A read operation within a NAND type flash memory is executed on a page by page basis. A page buffer circuit that senses a bit line voltage reads data from memory cells connected to a selected wordline in a selected block. The read data of the page buffer circuit is stored in latches included in the page buffer circuit and then output to data lines.

Each memory cell is defined as either an ON-cell (erased cell) and an OFF-cell (programmed cell) according to its programming state. An OFF-cell has a high threshold voltage due to the presence of electrons injected onto the floating gate of its constituent memory cell transistor. An ON-cell has a low threshold voltage because any electrons previously injected onto its floating gate are removed during an erase operation.

FIG. (FIG.) 1 is a flow chart illustrating a conventional method of reading data from a flash memory device. Referring to FIG. 1, bit lines are discharged to a ground voltage VSS in a standby state or an idle state before the read operation is executed (S101). When associated read and address commands are received, the read operation begins by establishing the address of a selected memory cell from which data is to be read on the basis of the received commands (S103).

Then, the bit line connected to the selected memory cell from which data will be read, referred to as the "selected bit line," is pre-charged to a power supply voltage VDD, and a row decoder sets signal lines including the bit lines to a predetermined voltage for the read operation (S105). The operation of setting the signal lines including the bit lines to the predetermined voltage by the row decoder is well known in the art so a more detailed explanation is omitted here.

After the signal lines including the bit lines are set to the predetermined voltage by the row decoder such that the read operation may be executed, the selected bit line is developed according to whether the selected cell is an ON-cell or an OFF-cell (S107). Specifically, the voltage of the selected bit line is gradually decreased when the selected cell is an ON-cell and the voltage of the selected bit line is maintained constant at the power supply voltage VDD when the selected cell is an OFF-cell.

After the selected bit line is developed, a sense amplifier senses and amplifies the resulting voltage variation for the selected bit line (S109). The sensed and amplified data is transmitted to a data output circuit to complete the read operation. Here again, the operation of the sense amplifier and the data output circuit are well known in the art.

After the read operation is completed, the selected bit line is discharged to ground voltage VSS during a recovery operation so that the bit lines are all discharged (S111). Accordingly, the flash memory device is returned to the standby state or idle state (S113).

FIG. 2 is a graph comparing the developed voltage variations between an ON-cell and an OFF-cell that arise during the conventional method of reading data from a flash memory device. FIG. 3 is a related conceptual diagram illustrating the development of noise during the conventional read operation. This noise is caused by a coupling capacitance (region A in FIG. 3) between a selected bit line and adjacent bit lines.

In the flash memory device, a wordline is commonly connected to memory cells belonging to a memory block. Thus, the wordline connected to the selected memory cell not only activates the selected bit line but also unselected bit lines. Furthermore, the selected bit line and the unselected bit lines are all discharged to ground voltage VSS in the standby state. Accordingly, when the voltage of the selected bit line is sensed and amplified while the unselected bit lines are discharged to ground voltage VSS, the coupling capacitance between the selected bit line and adjacent unselected bit line causes the voltage apparent on the unselected bit line to increase in the direction of voltage VDD. This voltage increase on the unselected bit line acts as noise, potentially changing the programming state of a memory cell adjacent to the selected cell. Accordingly, when data is subsequently read from the adjacent memory cell, an erroneous programming state is detected (e.g., a previously programmed OFF-cell is read as an ON-cell).

SUMMARY OF THE INVENTION

Embodiments of the invention provide a flash memory device and related method of reading data from the flash memory device. The flash memory device is capable of pre-charging bit lines in a standby state to minimize coupling capacitance between adjacent bit lines during the read operation in order to reduce or eliminate coupling noise.

In one embodiment, the invention provides a method of reading data from a flash memory device, the flash memory device comprising; a memory cell array including at least one memory block comprising a plurality of cell strings, each cell string having a string select transistor, at least one memory cell and a global select transistor, wherein the string select transistors of the plurality of cell strings are connected to at least one string select line, the global select transistors of the plurality of cell strings are connected to at least one global select line, and the memory cells of the plurality of cell strings connected to at least one wordline, wherein the plurality of cell strings are each respectively connected to a corresponding bit line, and the sources of the global select transistors are connected to a common source line, and the method comprises; pre-charging the bit lines to a first voltage in a standby state, discharging a selected bit line connected to a selected memory cell to a second voltage in response to a read command, and reading data stored in the selected memory cell in response to the read command.

In another embodiment, the invention provides a flash memory device comprising; a memory cell array including at least one memory block comprising a plurality of cell strings, each cell string being respectively connected to a corresponding bit line, wherein each cell string comprises a string select transistor, at least one memory cell, and a global select transistor, the string select transistor being connected to at least one string select line, the global select transistor being connected to at least one global select line and the sources of the global select transistors connected to a common source line, and the memory cells being connected to at least one wordline, a row decoder respectively applying predetermined voltages to the string select line, the global select line and the wordline, and a column select circuit applying a predetermined voltage to each bit line and pre-charging bit line to a first voltage in a standby state.

DESCRIPTION OF EMBODIMENTS

Figure 1:
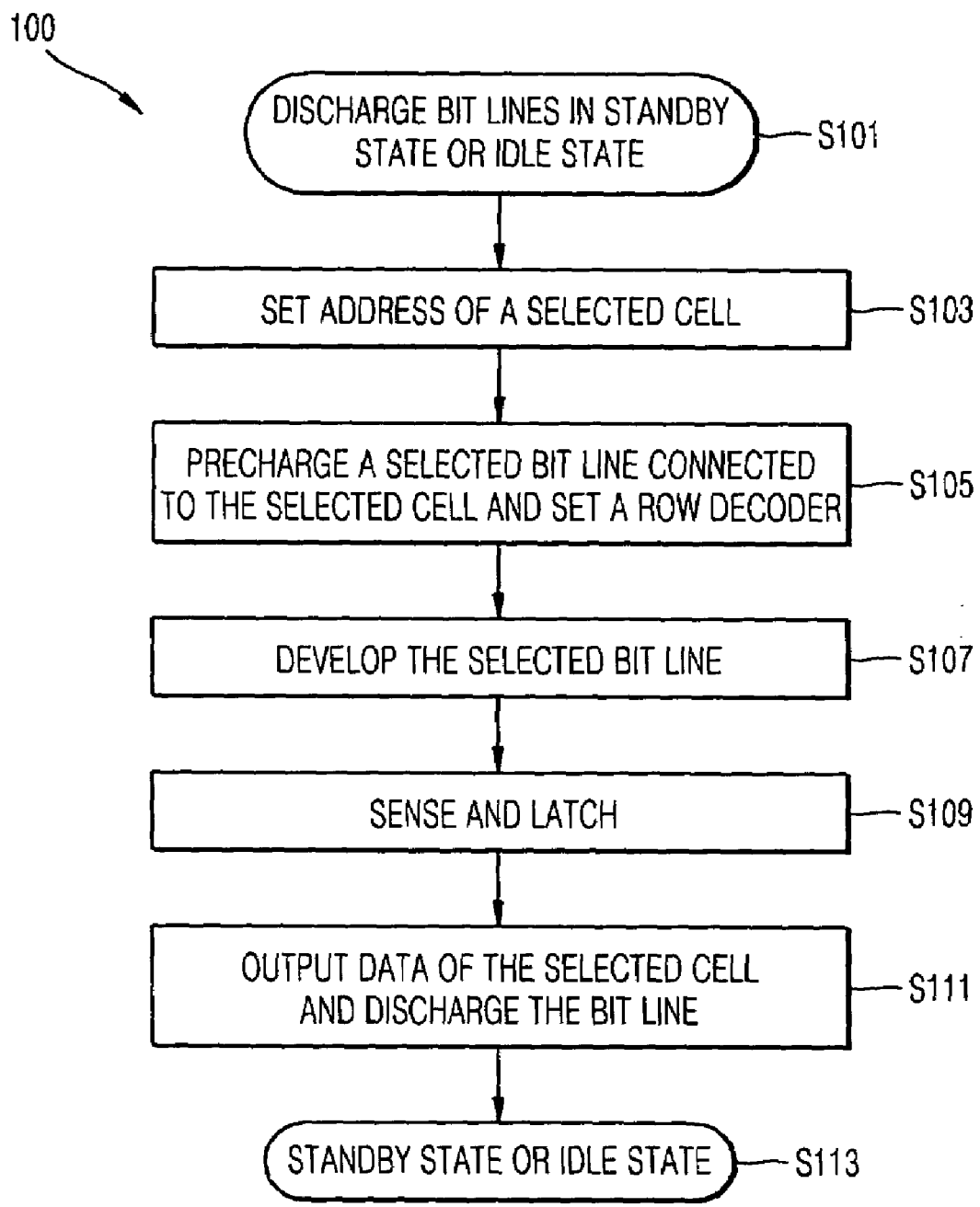
FIG. 1 is a flow chart illustrating a conventional method of reading data from a flash memory device.
Figure 2:
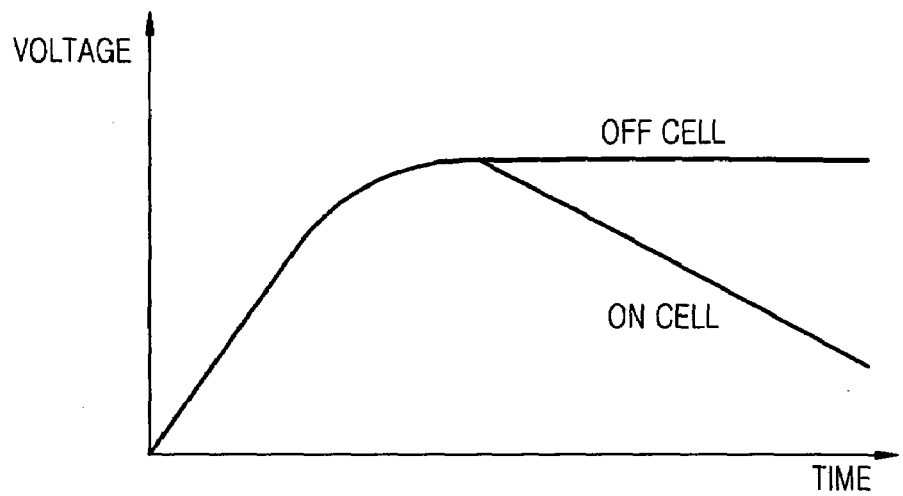
FIG. 2 is a graph illustrating voltage variations between an ON-cell and an OFF-cell in the conventional method of reading data from the flash memory device.
Figure 3:
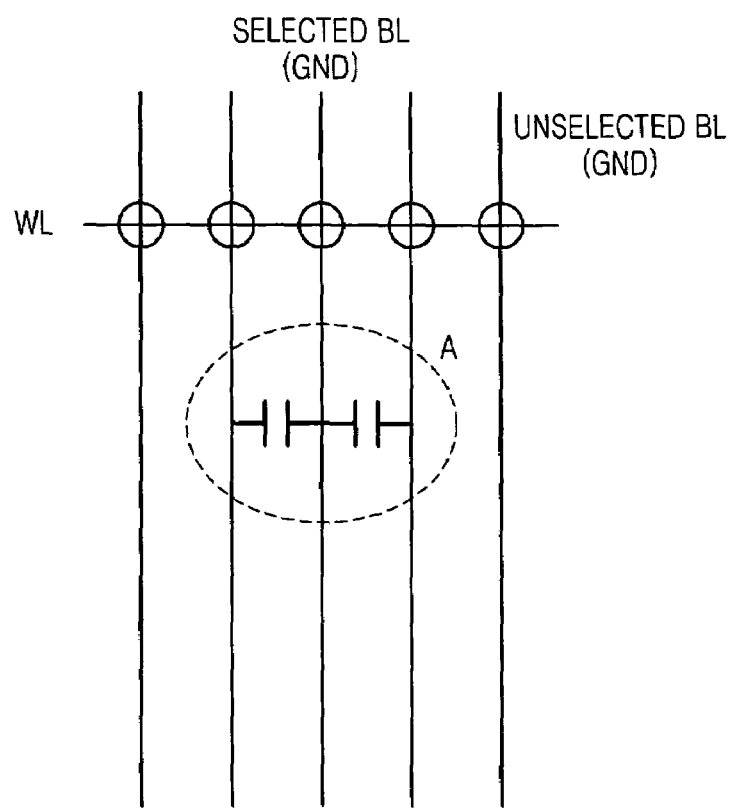
FIG. 3 is a diagram for illustrating the development of noise caused by a coupling capacitance between a selected bit line and an adjacent bit line in the conventional method of reading data from a flash memory device.

Embodiments of the invention will now be described in some additional detail with reference to the accompanying drawings. The invention may, however, be embodied in many different forms and should not be construed as being limited to only the embodiments set forth herein. Rather, these embodiments are presented as teaching examples. Throughout the written specification and drawings, like reference numerals are used to refer to like or similar elements.

Figure 7:
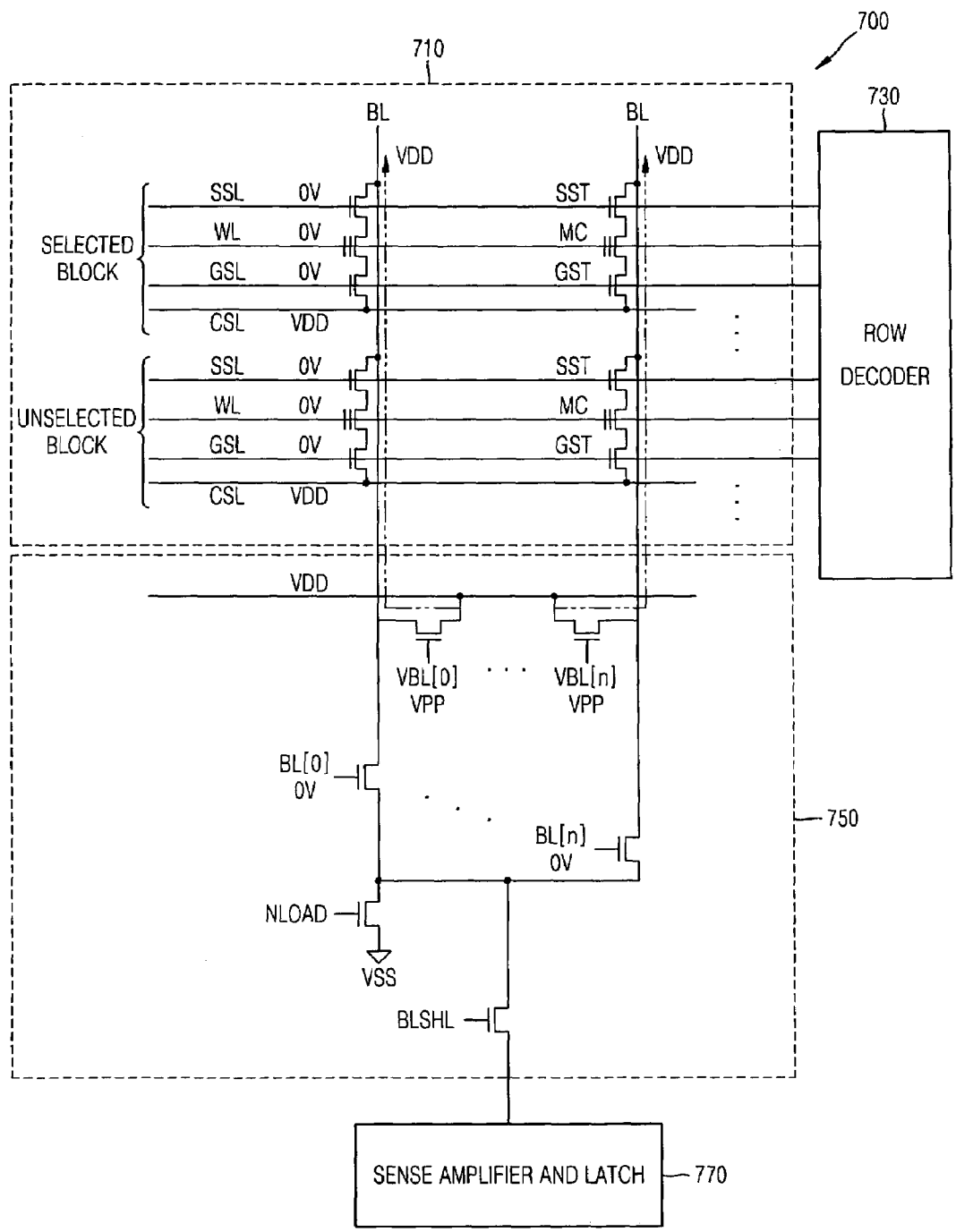
FIG. 7 is a simplified circuit diagram explaining voltage conditions for signal lines of a flash memory device in a standby state according to an embodiment of the invention.

A flash memory device 700 according to an embodiment of the present invention will first be explained with reference to FIG. 7. FIG. 7 is intended to illustrate exemplary voltage conditions for the constituent signal lines of flash memory device 700 in a standby state according to an embodiment of the invention.

Flash memory device 700 generally includes a memory cell array 710, a row decoder 730, a column select circuit 750 and a sense amplifier 770. Memory cell array 710 of the flash memory device 700 includes at least one memory block having a plurality of cell strings. FIG. 7 illustrates only two memory blocks including a selected block and an unselected block and two cell strings per each of these memory blocks. However, it is understood by one of ordinary skill in the art that the number of memory blocks and the number of cell strings are not limited to only this example which has been simplified for purposes of explanation.

In the illustrated example, each cell string in the respective memory blocks includes a string select transistor SST, at least one memory cell MC and a global select transistor GST. FIG. 7 illustrates only a single memory cell MC included in each cell string, however, it is understood by one of ordinary skill in the art that a various number of memory cells, for example, 16 or 32 memory cells, can be included in a single cell string.

The string select transistor SST of each cell string is connected to at least one string select line SSL and the global select transistor GST of each cell string is connected to at least one global select line GSL. The memory cells MC of each cell string are connected to at least one wordline WL. Each cell string is respectively connected to a corresponding bit line BL. The sources of the global select transistors GST in the respective cell strings are connected to a common source line CSL.

Row decoder 730 applies predetermined voltages to the string select line SSL, the global select line GSL, the wordline WL and the common source line CSL. That is, row decoder 730 respectively supplies appropriate voltages to the string select line SSL, the global select lines GSL, the wordline WL and the common source line CSL according to a current mode of operation (e.g., programming, erase or read operations). The voltages applied to the string select line SSL, the global select line GSL, the wordline WL and the common source line CSL according to conditions of the programming, erase and read operations are well known in the art, so that a detailed explanation thereof is omitted.

Row decoder 730 according to an embodiment of the present invention pre-charges the common source line CSL to a first voltage in a standby state. The operation of row decoder 730 will be explained in some additional detail hereafter.

Column select circuit 750 applies a predetermined voltage to a plurality of bit lines BL. In the illustrated embodiment, column select circuit 750 pre-charges the plurality of bit lines BL to the first voltage in the standby state. The pre-charging operation performed by column select circuit 750 will be described in some additional detail hereafter.

When a read command is applied to the flash memory device to start a read operation, column select circuit 750 discharges a selected bit line connected to a selected memory cell to a second voltage. The read operation is performed on the selected cell connected to the selected bit line in response to an address command associated with the read command.

When a predetermined operation including the read operation is completed and the flash memory device is returned to the standby state or the idle state, column select circuit 750 pre-charges the plurality of bit lines BL to the first voltage in the standby state. In the illustrated embodiment, the first voltage is a power supply voltage VDD and the second voltage is a ground voltage VSS. However, it is understood by one of ordinary skill in the art that the first voltage and the second voltage are not limited thereto.

Figure 4:
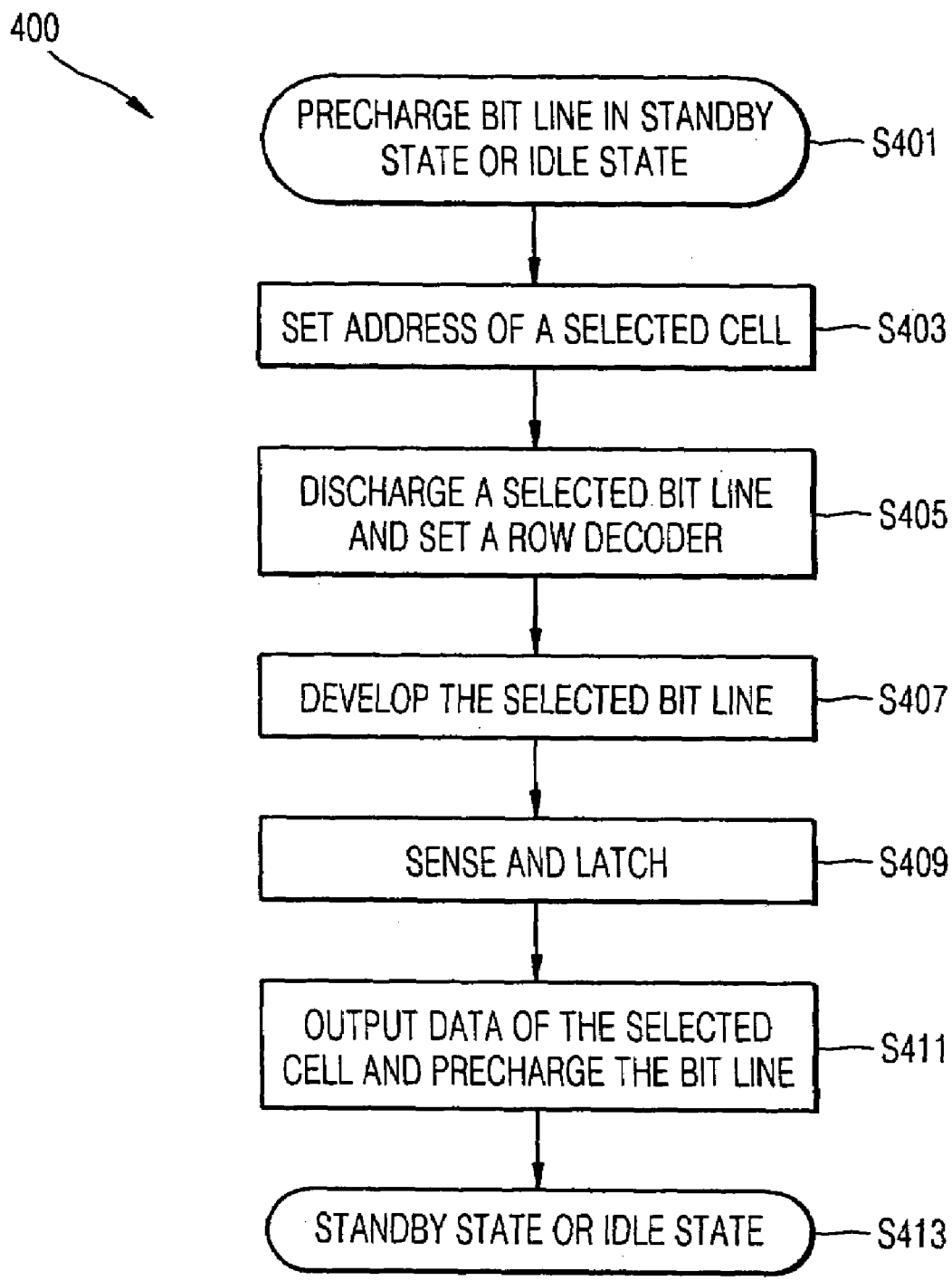
FIG. 4 is a flow chart illustrating a method of reading data from a flash memory device according to an embodiment of the invention.
Figure 8:
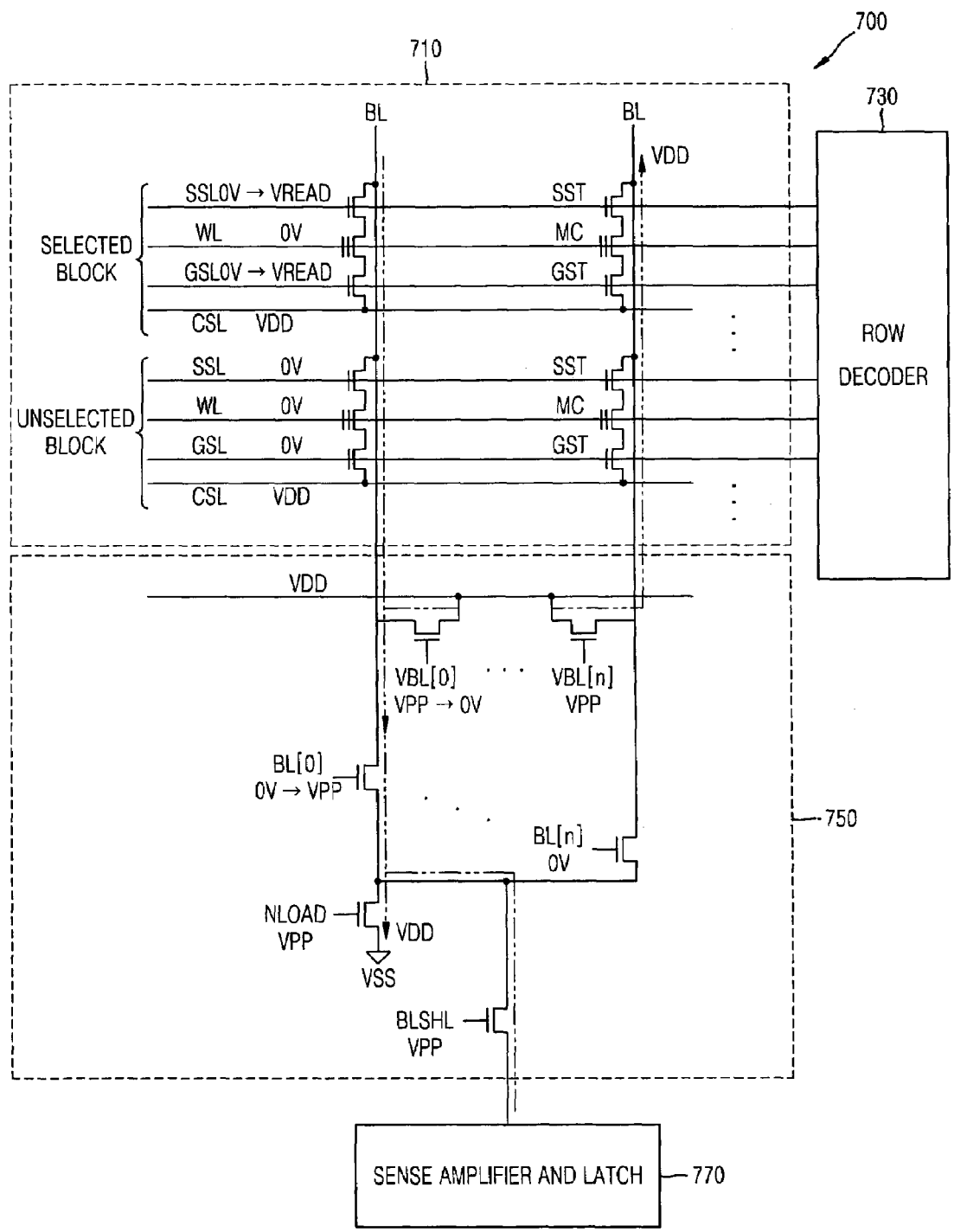
FIG. 8 is another simplified circuit diagram explaining voltage conditions for signal lines of a flash memory device when bit lines are discharged before a read operation, according to an embodiment of the invention.
Figure 9:
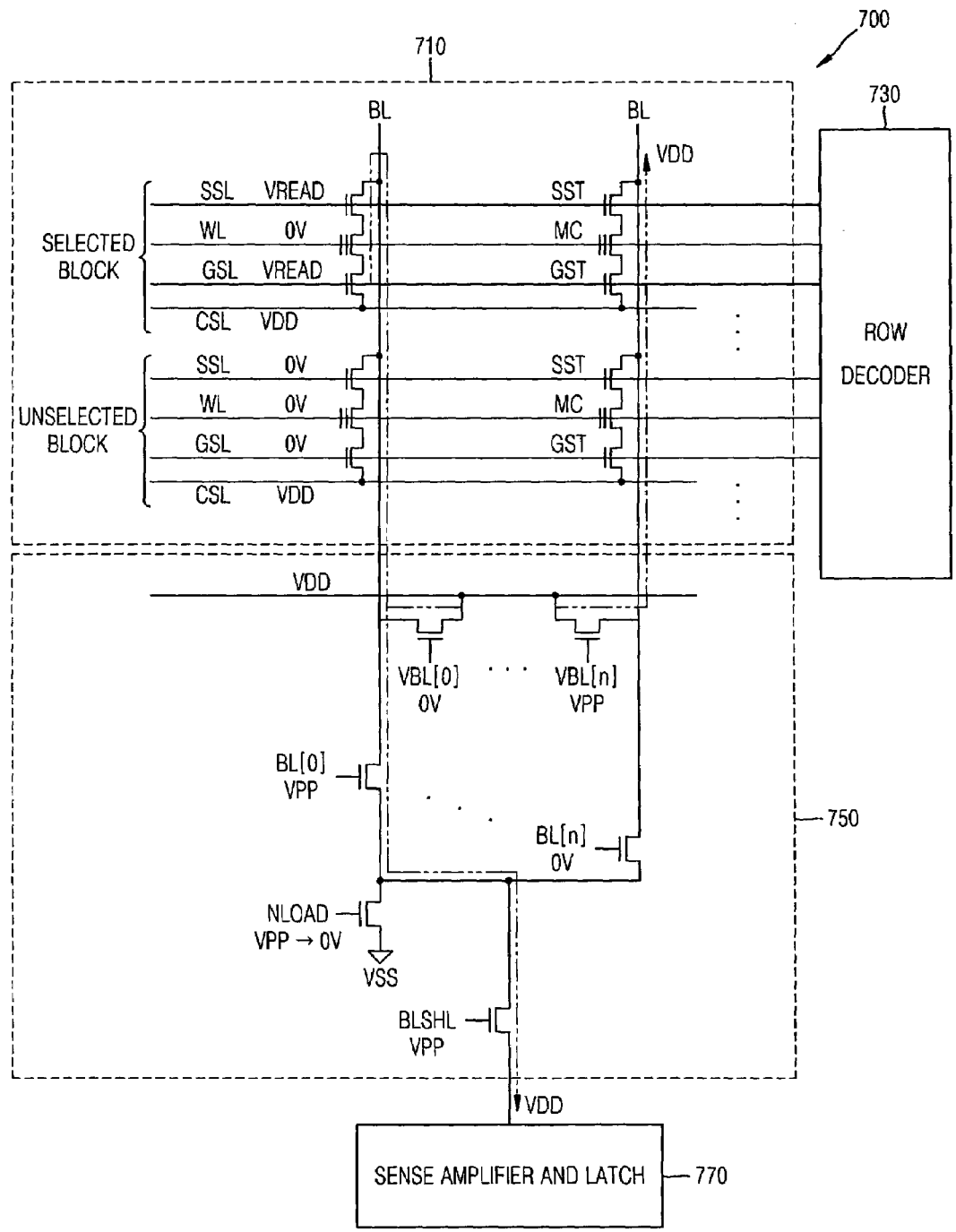
FIG. 9 is another simplified circuit diagram explaining voltage conditions for signal lines of a flash memory device in a read operation, according to an embodiment of the invention.

A method of reading data 400 from a flash memory device according to an embodiment of the invention will be explained with reference to FIGS. 4, 7, 8 and 9. FIG. 4 is a flow chart of the method of reading data 400 from a flash memory device according to an embodiment of the invention. FIG. 7 is a simplified circuit diagram intended to explain voltage conditions for signal lines of an exemplary flash memory device in a standby state according to an embodiment of the invention. FIG. 8 is another simplified circuit diagram intended to explain voltage conditions for signal lines of the flash memory device when bit lines are discharged prior to a read operation according to an embodiment of the invention. FIG. 9 is yet another simplified circuit diagram intended to explain voltage conditions for signal lines of the flash memory device during the read operation according to an embodiment of the invention.

Referring to FIGS. 4 and 7, bit lines BL including a selected bit line connected to a selected cell and unselected bit lines are all pre-charged to a power supply voltage VDD in the standby state or the idle state before the read operation is executed (S401). In the illustrated embodiment, the common source line CSL is also pre-charged to the power supply voltage VDD.

The string select line SSL, the global select line GSL and the wordline WL are provided with the ground voltage VSS. Bit line control signals BL[0] through BL[n] for controlling connection of the bit lines BL and sense amplifiers 770 are also at the ground voltage VSS.

When a read command and an address command are input after the bit lines BL are all pre-charged to the power supply voltage VDD in the standby state or the idle state, the read operation is executed. Specifically, the address corresponding to the selected memory cell is set in response to the address command (S403). Then, only the selected bit line connected to the selected memory cell is discharged to the ground voltage VSS (S405). This step will be explained in some additional detail with reference to FIG. 8 hereafter.

A boosted voltage VPP, greater than the power supply voltage VDD, is then applied as a load signal NLOAD in relation to the address corresponding to the selected memory cell. The boosted voltage VPP is also applied to a select bit line control signal BL[0], and the string select line SSL and the global select line GSL of the string to which the selected cell is connected are provided with a read voltage VREAD (for example, 4V or 5V). Accordingly, the selected bit line and the sense amplifier are discharged to the ground voltage VSS.

The voltage of the selected bit line discharged to the ground voltage VSS is developed in accordance with the current state of the selected cell (S407). The voltage of the selected bit line is increased in accordance with charge supplied from the common source line CSL when the selected cell is an ON-cell. The voltage of the selected bit line is maintained constant when the selected cell is an OFF-cell. By using this developing process for the selected bit line, the voltage difference between the bit line connected to an ON-cell and the bit line connected to an OFF-cell increases.

An operation of outputting the developed voltage of the selected bit line as output data will be explained with reference to FIG. 9. While the selected bit line is developed, the ground voltage VSS is applied to the selected bit line as the load signal NLOAD. When the voltage of the selected bit line is developed in response to the state of the selected memory cell connected to the selected bit line, data loaded on the selected bit line is transmitted to sense amplifier 770. Sense amplifier 770 latches the transmitted data (S409) and the latched data is output through a conventional data output process (S411).

After the data is output through the conventional data output process, the selected bit line is pre-charged to the power supply voltage VDD through a recovery operation (S411). Accordingly, the bit lines BL are all pre-charged to the power supply voltage VDD and returned to the standby state or the idle state (S413). When a subsequent read operation is performed, the aforementioned process is repeated.

Figure 5:
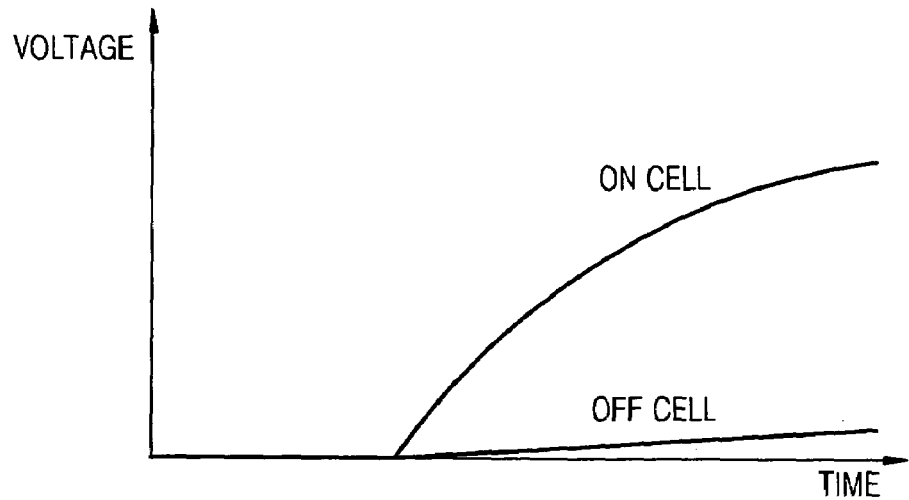
FIG. 5 is a graph illustrating voltage variations between an ON-cell and an OFF-cell in the method of reading data from a flash memory device according to an embodiment of the invention.
Figure 6:
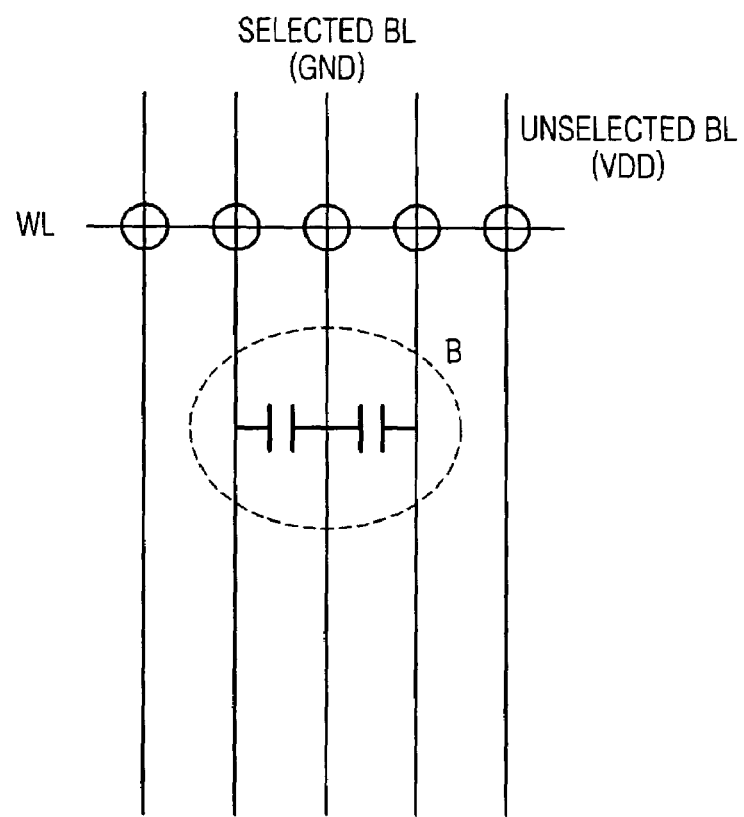
FIG. 6 is a diagram for explaining a bit line shielding effect in the method of reading data from a flash memory device according to an embodiment of the invention.

FIG. 5 is a graph comparing voltage variations between an ON-cell and an OFF-cell in the method of reading data from a flash memory device according to an embodiment of the invention. FIG. 6 is a diagram illustrating the bit line shielding effect implicate in the method of reading data from a flash memory device, according to an embodiment of the present invention.

The illustrated embodiment of FIG. 5 pre-charges a selected bit line and an unselected bit line to the power supply voltage VDD in the standby state such that the common source line CSL and the bit lines equal to the power supply voltage VDD even when an unselected cell is an ON-cell. Accordingly, coupling noise between adjacent bit lines caused by the coupling capacitance (See, area B in FIG. 6) can be removed to thereby shield the adjacent bit lines.

While the foregoing embodiments of the invention have been drawn to a NAND type flash memory device for purposes of explanation, those of ordinary skill in the art will understand that the present invention may be equally well applied to NOR type flash memory, and other non-volatile memory device having a structure similar to the NOR type flash memory.

While the present invention has been particularly shown and described with reference to exemplary embodiments thereof, it is understood by those of ordinary skill in the art that various changes in form and details may be made therein without departing from the scope of the present invention as defined by the following claims.

What is claimed is:

1. A method of reading data from a flash memory device, the flash memory device comprising:
   a memory cell array including at least one memory block comprising a plurality of cell strings, each cell string having a string select transistor, at least one memory cell and a global select transistor,
   wherein the string select transistors of the plurality of cell strings are connected to at least one string select line, the global select transistors of the plurality of cell strings are connected to at least one global select line, and the memory cells of the plurality of cell strings connected to at least one wordline,
   wherein the plurality of cell strings are each respectively connected to a corresponding bit line among a plurality of bit lines, and the sources of the global select transistors are connected to a common source line, and the method comprising:
   pre-charging the plurality of bit lines to a first voltage during a standby state;
   after pre-charging the plurality of bit lines, discharging a selected bit line indicated by an address associated with a read command from among the plurality of bit lines and connected to a selected memory cell from the first voltage to a second voltage less than the first voltage in response to the read command;

developing an output voltage on the selected bit line from the second voltage in relation to a data value stored by the selected memory cell; and reading the data value stored in the selected memory cell in response to the developed output voltage.

2. The method of claim 1, further comprising:
pre-charging the common source line to the first voltage during the standby state.

3. The method of claim 1, wherein the reading of the data value comprises:
sensing and amplifying the developed output voltage; and
outputting the data value in relation to the sensed and amplified output voltage.

4. The method of claim 1, further comprising:
for each one of the at least one memory blocks, applying the second voltage to the string select line, the word line and the global select line during the standby state.

5. The method of claim 1, further comprising:
pre-charging the plurality of bit lines to the first voltage after the reading of the data value.

6. The method of claim 1, wherein the first voltage corresponds to a power supply voltage.

7. The method of claim 1, wherein the second voltage corresponds to a ground voltage.

8. The method of claim 1, wherein the flash memory device is a NAND type flash memory.

9. A flash memory device comprising:
a memory cell array including a plurality of memory blocks including a selected memory block indicated by an address associated with a read command and a non-selected memory block, wherein each memory block in the plurality of memory blocks comprises;
a plurality of cell strings, wherein each cell string is respectively connected to a corresponding bit line among a plurality of bit lines and, each cell string comprises a string select transistor, at least one memory cell, and a global select transistor, wherein each string select transistor for each cell string is respectively connected to a string select line, each global select transistor is respectively connected to a global select line, the source of each global select transistor is connected to a common source line, and the memory cells are connected to respective wordlines;
a column select circuit pre-charging each one of the plurality of bit lines to a first voltage during a standby state preceding execution of a read command; and
a row decoder respectively applying a second voltage less than the first voltage to string select lines, global select lines and wordlines during the standby state.

10. The flash memory device of claim 9, wherein the row decoder pre-charges common source lines to the first voltage during the standby state.

11. The flash memory device of claim 9, wherein the column select circuit discharges only a selected bit line among the plurality of bit lines associated with the selected memory block and connected to a selected memory cell to the second voltage in response to during execution of the read command.

12. The flash memory device of claim 11, wherein the column select circuit again pre-charges the plurality of bit lines to the first voltage following execution of the read command.

13. A method of reading data from a memory array, wherein the memory cell array comprises:
a plurality of memory blocks including a selected memory block indicated by an address associated with a read command and a non-selected memory block, wherein each memory block in the plurality of memory blocks comprises a plurality of cell strings, wherein each cell string is respectively connected to one of a plurality of bit lines and each cell string comprises a plurality of memory cells connected between a select transistor and a global select transistor, wherein each string select transistor is connected to a string select line, the gate of each global select transistor is connected to a global select line, the source of each global select transistor is connected to a common source line, and the gate of each one of the plurality of memory cells is connected to a respective word line; and the method comprises:
receiving the read command;
prior to executing the read command, precharging each one of the plurality of bit lines to a power supply voltage;
after precharging each one of the plurality of bit lines to the power supply voltage, executing the read command by discharging from the power supply voltage to a ground voltage only a selected bit line indicated among the plurality of bit lines by the address; and
after discharging only the selected bit line, developing from the ground voltage an output voltage on the selected bit line in relation to the data stored in a selected memory cell.

14. The method of claim 13, further comprising:
pre-charging the common source lines to the first voltage during the standby state.

15. The method of claim 14, wherein pre-charging each one of the plurality of bit lines comprises:
applying the power supply voltage to each one of the plurality of bit lines and the common source lines; and simultaneously
applying ground voltage to the string select lines, global select lines, and word lines of the selected memory block and the non-selected memory block.

16. The method of claim 14, wherein discharging to the ground voltage only the selected bit line comprises:
applying ground voltage to the string select line, global select line, and word lines of the non-selected memory block, and also to the wordlines of the selected memory block; and simultaneously
applying a read voltage to the string select line and global select line of the selected memory block.

17. The method of claim 16, wherein the developed output voltage remains substantially at the power supply voltage level when the selected memory cell is programmed in an OFF state.

18. The method of claim 16, wherein the developed output voltage falls from the power supply voltage towards the ground voltage when the selected memory cell is programmed in an ON state.

* * * * *